(12) United States Patent
Lee

(10) Patent No.: US 8,422,305 B2
(45) Date of Patent: Apr. 16, 2013

(54) METHOD OF PROGRAMMING NONVOLATILE MEMORY DEVICE

(75) Inventor: Hee Youl Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 259 days.

(21) Appl. No.: 12/826,123

(22) Filed: Jun. 29, 2010

(65) Prior Publication Data
US 2010/0329021 A1 Dec. 30, 2010

(30) Foreign Application Priority Data

Jun. 29, 2009 (KR) .................... 10-2009-0058490
Jun. 25, 2010 (KR) .................... 10-2010-0060448

(51) Int. Cl.
*G11C 16/06* (2006.01)

(52) U.S. Cl.
USPC ............ 365/185.22; 365/185.09; 365/185.14; 365/185.29

(58) Field of Classification Search ............. 365/185.22, 365/185.19, 185.09, 185.14, 185.29
See application file for complete search history.

(56) References Cited

U.S. PATENT DOCUMENTS

| 6,914,823 B2 * | 7/2005 | Chen et al. ............... 365/185.22 |
| 7,042,766 B1 * | 5/2006 | Wang et al. ............... 365/185.22 |
| 2005/0219909 A1 * | 10/2005 | Futatsuyama et al. ... 365/185.22 |
| 2010/0002514 A1 * | 1/2010 | Lutze et al. ............... 365/185.17 |
| 2010/0002515 A1 * | 1/2010 | Lutze et al. ............... 365/185.17 |

FOREIGN PATENT DOCUMENTS

| KR | 1020060114319 | 11/2006 |
| KR | 1020080069498 | 7/2008 |

OTHER PUBLICATIONS

Notice of Preliminary Rejection issued from Korean Intellectual Property Office on Aug. 26, 2011.

* cited by examiner

*Primary Examiner* — Toan Le
(74) *Attorney, Agent, or Firm* — IP & T Group LLP

(57) ABSTRACT

A method of programming a nonvolatile memory device includes inputting program data to page buffers; performing a program operation and a program verification operation until threshold voltages of memory cells included in a selected page reach a target level according to the program data; when the threshold voltages of the memory cells reach the target level, performing an over-program verification operation to determine over-programmed memory cells in the memory cells; and making a determination of whether error checking and correction (ECC) processing for the over-programmed memory cells is feasible.

17 Claims, 4 Drawing Sheets

METHOD OF PROGRAMMING NONVOLATILE MEMORY DEVICE

CROSS-REFERENCE TO RELATED APPLICATION

Priority to Korean patent application number 10-2009-0058490 filed on Jun. 29, 2009, and Korean patent application number 10-2010-0060448 filed on Jun. 25, 2010 the entire disclosures of which are incorporated by reference herein, is claimed.

BACKGROUND

Exemplary embodiments relate to a method of programming a nonvolatile memory device and, more particularly, to a program method for cases where over-programmed cells occur.

FIGS. 1A and 1B are graphs illustrating concerns related to a known art.

With an increase in the level of a program voltage Vpgm Bias supplied to a selected word line, the threshold voltages (Cell Vt) of memory cells to be programmed increase. It is desired that as in FIG. 1A, the level of a voltage supplied to the word line is in direct proportion to the threshold voltages Vt of memory cells. However, an increase of the threshold voltage Vt depends on different factors, and the memory cells have different electrical characteristics. Accordingly, as shown in FIG. 1B, the level of the program voltages Vpgm Bias supplied to the word line, while somewhat proportional to the threshold voltage Cell Vt of the memory cells, but is not directly proportional to the threshold voltages Cell Vt of the memory cells.

A program operation is performed using an incremental step pulse program (ISPP) method of raising the threshold voltages of memory cells to be programmed while gradually raising the level of a program voltage Vpgm supplied to a selected word line. In particular, if in the program operation using the incremental step pulse program (ISPP) method, the threshold voltages of the memory cells irregularly rise, the reliability of the program operation may deteriorate. According to an example, a step voltage of a program voltage Vpgm (i.e., an increment of the program voltage Vpgm) is 0.5 V and the threshold voltages of memory cells to be programmed range from 1.0 V to 1.5 V. Here, when the program voltage Vpgm of 17 V has been supplied to a selected word line and thus the threshold voltages of the memory cells have reached 0.6 V, the memory cells are determined not to have passed a program verification operation in an $(N-1)^{th}$ program operation because the threshold voltage of 0.6 V is lower than the minimum voltage (1.0 V) of the programmed range.

Next, if an $N^{th}$ program voltage Vpgm of 17.5 V increases by 0.5 V from the program voltage Vpgm of 17 V is supplied to the selected word line, the threshold voltages of the memory cells is expected to be 1.1 V which is the previous threshold voltage of 0.6 V increased by 0.5 V. If the threshold voltages of, for example, all the memory cells have reached 1.0 V, a program verification operation is determined to be a pass. However, if the threshold voltages of the memory cells are not increased as expected (for example, increase only by 0.3V) when the $N^{th}$ program voltage Vpgm is supplied to the selected word line, the threshold voltages become 0.9 V and thus the program verification operation is determined not to be a pass. In such a case, an $(N+1)^{th}$ program operation is performed and an $(N+1)^{th}$ program voltage of 18.0 V is supplied to the selected word line. In this case, the threshold voltages of the memory cells is expected to rise by 0.7 V in which 0.2 V not increased in the $N^{th}$ program operation and an increment (i.e., 0.5 V) of the $(N+1)^{th}$ program operation are added together. That is, the $(N+1)^{th}$ program operation is performed in order to raise the threshold voltages of the memory cells to 1.6 V. Here, the threshold voltages of 1.6 V when so programmed are higher than a voltage level for a program verification operation to be a pass. Accordingly, such a program is called an over-program. Over-programmed memory cells have high threshold voltages. Thus, when interference is generated during a program operation for neighboring memory cells, the threshold voltages of the over-programmed memory cells may rise. Here, the increased threshold voltages of the over-programmed memory cells may rise during a program operation for neighboring cells. If the risen threshold voltages rise to a threshold voltage corresponding to other data, different data from data stored when a program operation is performed may be read.

BRIEF SUMMARY

Exemplary embodiments relate to program and read operations with an improved reliability.

A method of programming a nonvolatile memory device according to an aspect of an exemplary embodiment includes inputting program data to page buffers; performing a program operation and a program verification operation until threshold voltages of memory cells included in a selected page reach a target level according to the program data; when the threshold voltages of the memory cells reach the target level, performing an over-program verification operation to determine over-programmed memory cells in the memory cells; and making a determination of whether error checking and correction (ECC) processing for the over-programmed memory cells is feasible.

A method of performing a program operation for a nonvolatile memory device according to another aspect of an exemplary embodiment includes inputting program data to page buffers; performing a program operation to raise threshold voltages of memory cells to be programmed by supplying a program voltage to a selected word line; performing a program verification operation to verify whether the threshold voltages of the memory cells have reached a target level by supplying a verification voltage to the selected word line; repeatedly performing the program operation by raising the program voltage until the threshold voltages of the memory cells reach the target level; and when the threshold voltages of the memory cells reach the target level, performing an over-program verification operation to determine whether there are over-programmed memory cells in the programmed memory cells.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Figure 1A:
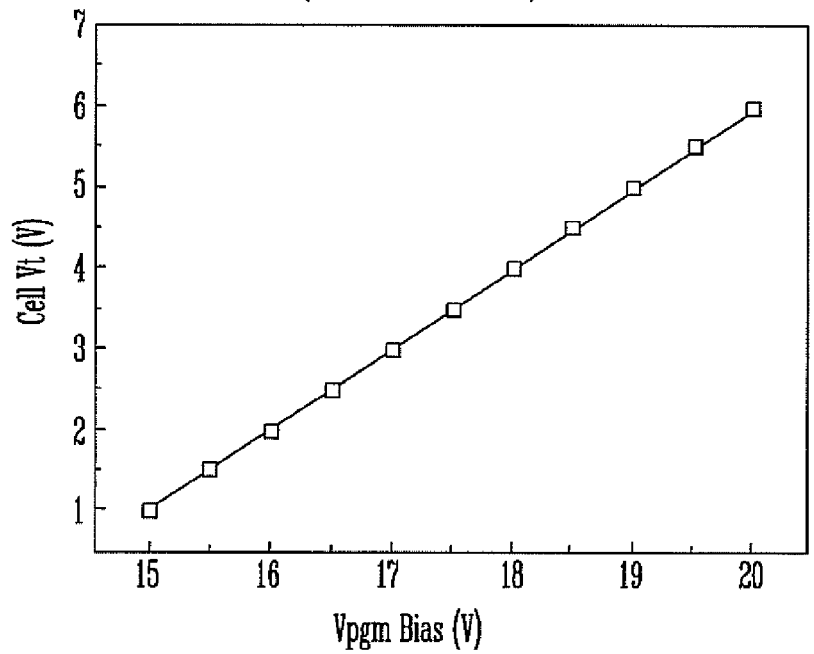
FIGS. 1A and 1B are graphs illustrating concerns related to a known art.
Figure 1B:
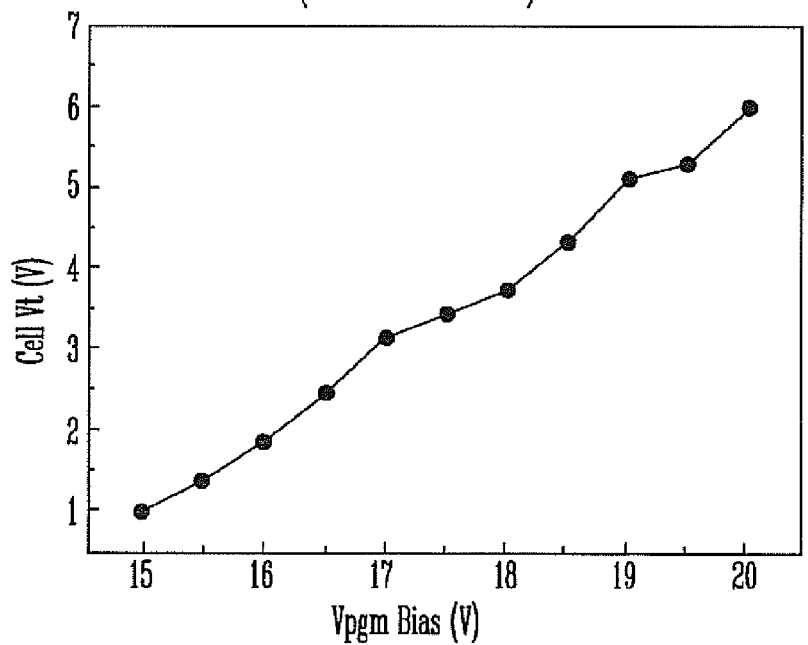
Figure 2:
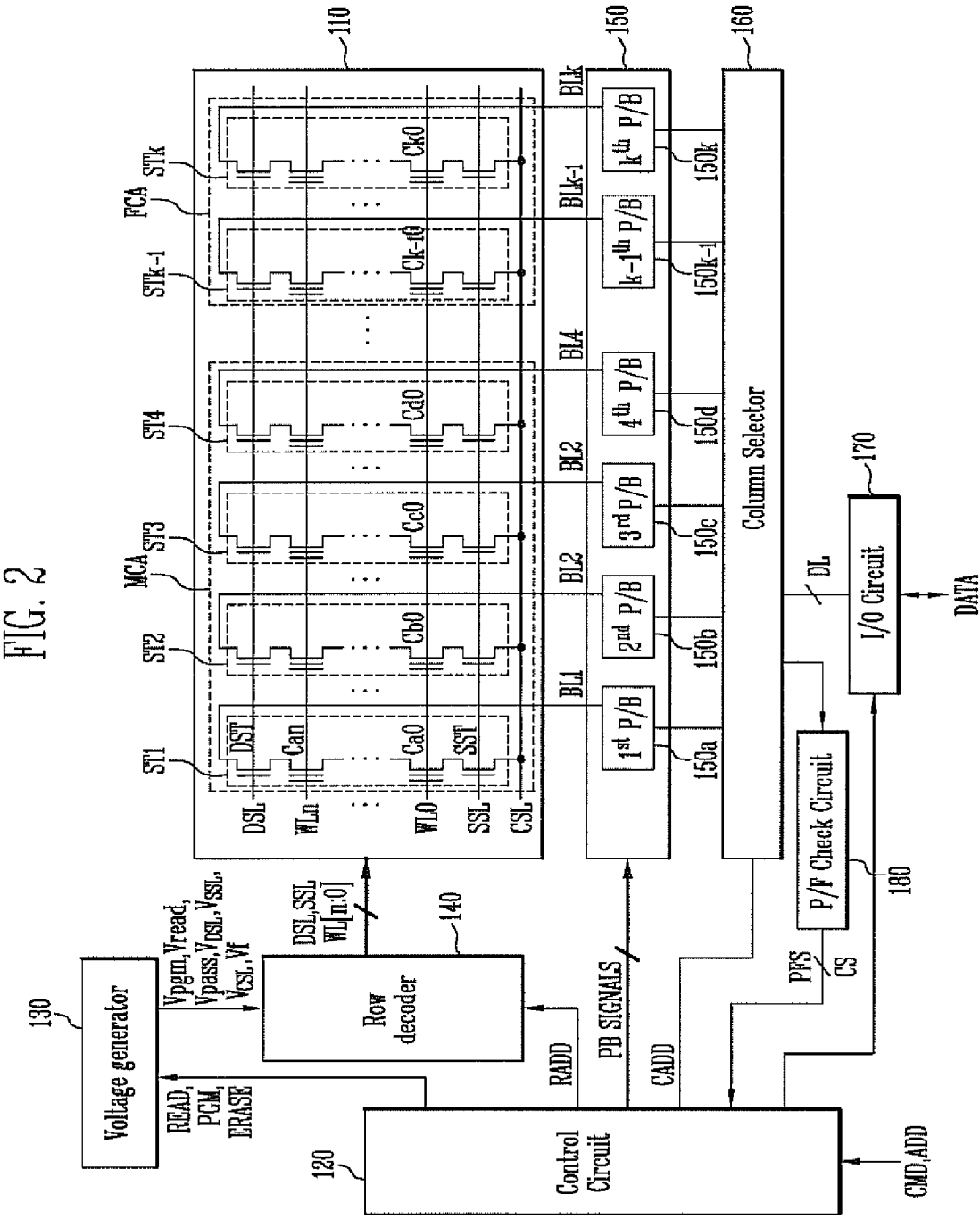
FIG. 2 is a block diagram of a nonvolatile memory device illustrating the program operation of an exemplary embodiment.

FIG. 2 is a block diagram of a nonvolatile memory device illustrating the program operation of an exemplary embodiment.

Referring to FIG. 2, the semiconductor memory device according to an exemplary embodiment includes a memory cell array 110, a control circuit 120, a voltage generator 130, a row decoder 140, a page buffer circuit 150, a column selector 160, an input/output (I/O) circuit 170, and a pass/fail (P/F) check circuit 180.

The memory cell array 110 includes a plurality of memory blocks. In FIG. 2, one of the plurality of memory blocks is shown as an example. Each of the memory blocks includes a main cell array MCA and a flag cell array FCA.

The memory blocks may be classified on a page basis. The page includes memory cells Ca0 to Ck0 coupled to one word line (e.g., WL0). Further, the page may be divided into an even page and an odd page. Here, the even page includes the memory cells Ca0, Cc0, . . . , Ck-10 respectively coupled to even-numbered bit lines BL0, BL2, . . . , BLk-1. The odd page includes the memory cells Cb0, Cd0, . . . , Ck0 respectively coupled to odd-numbered bit lines BL1, BL3, . . . , BLk.

In the nonvolatile memory device, the memory block may be the smallest unit for performing erasure. The page (or the even page and the odd page) may be the smallest unit for performing a program operation or a read operation.

The memory cells included in the memory block may be divided into strings. That is, the memory block includes a plurality of the strings ST1 to STk. Each (e.g., ST1) of the strings includes a source select transistor SST coupled to a common source line CSL, the plurality of memory cells Ca0 to Can, and a drain select transistor DST coupled to the bit line BL1. The gate of the source select transistors SST are coupled to a source selection line SSL, the gates of the memory cells Ca0 to Can are coupled to respective word lines WL0 to WLn. The gates of drain select transistors DST are coupled to a drain selection line DSL. The strings ST1 to STk are coupled to the respective bit lines BL1 to BLk and commonly coupled to the common source line CSL.

The control circuit 120 internally generates a program operation signal PGM, a read operation signal READ, or an erasure operation signal ERASE in response to a command signal CMD, and also generates control signals PB SIGNALS for controlling the page buffers 150a to 150k of the page buffer circuit 150 according to the type of the operation. Further, the control circuit 120 internally generates a row address signal RADD and a column address signal CADD in response to an address signal ADD. Further, the control circuit 120 checks whether the threshold voltages (for example, all threshold voltages) of selected memory cells have risen to a minimum target level in response to a count signal CS, generated by the P/F check circuit 180, during a program operation and determines whether to finish the program operation based on a result of the check. Further, the control circuit 120 determines whether error correction is feasible (for example, possible) based on the number of error memory cells having a threshold voltage lower than the target level, from among the selected memory cells, and determines whether to correct the error memory cells using error checking and correction (ECC) processing or to select another page and then reprogram memory cells included in the selected page. A detailed operation is described later.

A voltage supply circuit supplies the strings ST1 to STk of a selected memory block with operation voltages for the program, erase, or read operation of memory cells in response to the signals READ, PGM, ERASE, and RADD of the control circuit 120. The voltage supply circuit includes the voltage generator 130 and the row decoder 140.

The voltage generator 130 outputs operation voltages Vpgm, Vread, Vpass, $V_{DSL}$, $V_{SSL}$, $V_{CSL}$, and Vf for programming, reading, or erasing memory cells to global lines in response to the operation signals PGM, READ, and ERASE (i.e., the internal command signals generated by the control circuit 120).

The row decoder 140 transfers the operation voltages of the voltage generator 130 to the strings ST1 to STk of a memory block, selected from among the memory blocks of the memory cell array 110, in response to the row address signal RADD of the control circuit 120. That is, the operation voltages are supplied to the local lines DSL, WL[n:0], and SSL of the selected memory block.

The page buffer circuit 150 includes the page buffers 150a to 150k respectively coupled to the bit lines BL1 to BLk. The page buffer circuit 150 supplies the bit lines BL1 to BL4 with respective voltages for storing data in the memory cells Ca0, Ck0 in response to the control signals PB SIGNALS of the control circuit 120. More particularly, the page buffers 150a to 150k precharge the bit lines BL1 to BLk during a program, erase, or read operation for the memory cells Ca0, Ck0 or latches data corresponding to the threshold voltages of the memory cells Ca0, Ck0, detected according to a shift in the voltages of the bit lines BL1 to BLk. That is, the page buffer circuit 150 controls the voltages of the bit lines BL1 to BLk based on data stored in the memory cells Ca0, . . . , Ck0 and detects data stored in the memory cells Ca0, Ck0.

The column selector 160 selects one of the page buffers 150a to 150k in response to the column address signal CADD and outputs data latched in a selected page buffer.

The I/O circuit 170 transfers external data DATA to the column selector 160 under the control of the control circuit 120 so that the external data DATA may be inputted to the page buffers 150a to 150k during a program operation. When the external data are sequentially inputted to the page buffers 150a to 150k, the page buffers 150a to 150k store the received data in respective internal latches. Further, during a read operation, the I/O circuit 170 externally outputs data received from the page buffers 150a to 150k via the column selector 160.

The P/F check circuit 180 determines an error memory cell having a threshold voltage lower than a target level, from among programmed memory cells, through a program verification operation performed during a program operation, and outputs a result of the check as a pass/fail signal PFC. Further, the P/F check circuit 180 counts the number of error memory cells and outputs a result of the count as the count signal CS.

The control circuit 120 controls the level of a program voltage supplied to a selected word line during a program operation for memory cells coupled to the selected word line and also controls the voltage generator 130 so that verification voltages Vf may be selectively supplied the selected word line during a program verification operation. Here, the control circuit 120 may control the voltage generator 130 in response to the count signal CS of the P/F check circuit 180.

Figure 3:
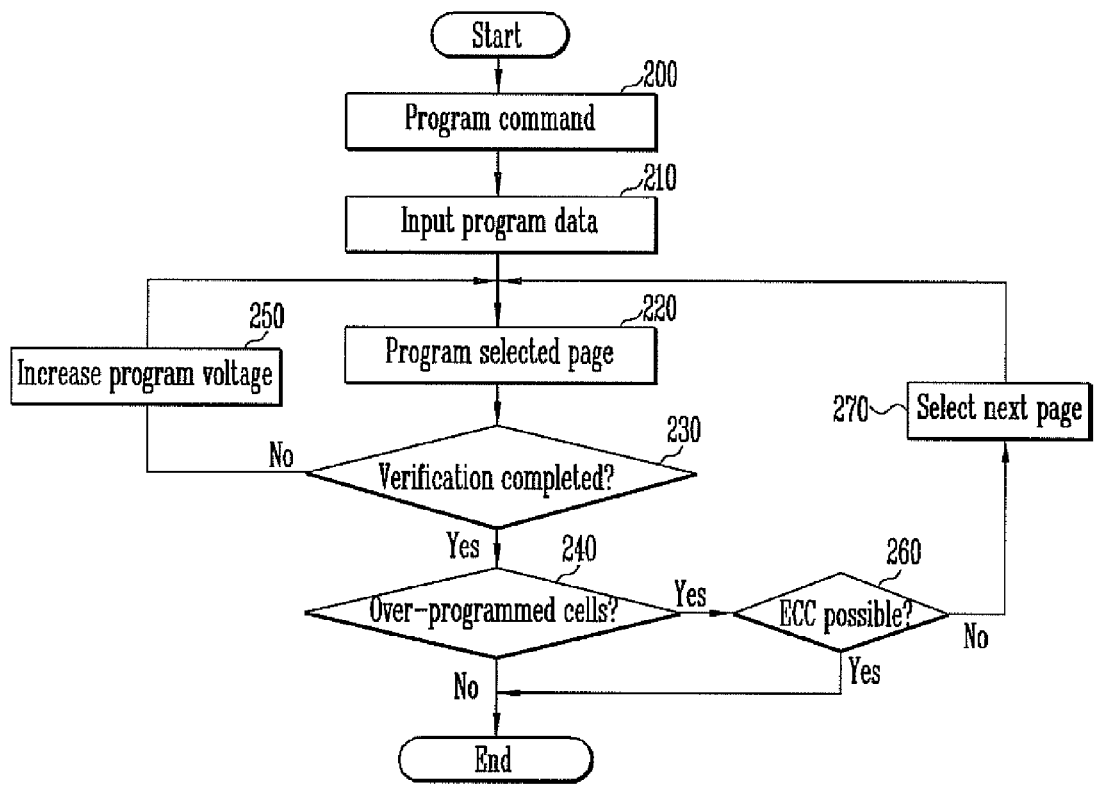
FIG. 3 is a flowchart illustrating a method of performing a program operation according to an exemplary embodiment.

FIG. 3 is a flowchart illustrating a method of performing a program operation according to an exemplary embodiment.

The program operation includes a program command step 200, a program data input step 210, a selected page program step 220, a verification completion determination step 230, a program voltage increase step 250, an over-programmed cell determination step 240, an error checking and correction (ECC) determination step 260, and a next page selection step 270.

Referring to FIG. 3, when a program command is generated by the control circuit 120 at step 200, program data are inputted to each of the plurality of page buffers 150a to 150k included in the page buffer circuit 150 at step 210.

A program operation is performed on memory cells included in a selected page using the inputted program data at step 220. Next, a program verification operation is performed in order to determine whether, for example, all the threshold voltages of the memory cells have reached a target level at step 230. Here, the program operation is performed by supplying a program voltage Vpgm to a selected word line and performed using an incremental step pulse program (ISPP) method in which the program voltage Vpgm is gradually increased by a step voltage. If, as a result of the program verification operation, some of the threshold voltages of the memory cells are determined not to have reached the target level, the program voltage Vpgm supplied to the selected word line is increased by a step voltage Vs at step 250 and then the process returns to the step 220. In the program verification operation, whether the threshold voltages (for example, all threshold voltages) of the memory cells have reached the target level is determined by comparing the program data, inputted to each of the page buffers, and voltage sensed from each of the memory cells. The steps 220, 230, and 250 are repeatedly performed until the threshold voltages (for example, all threshold voltages) of the memory cells included in the selected page reach the target level.

The method of performing a program operation is described in more detail below.

Figure 4:
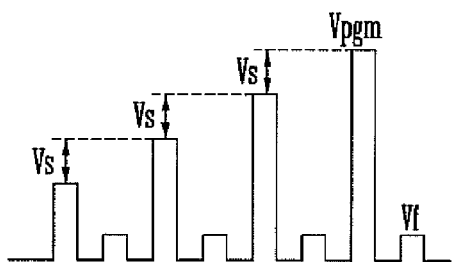
FIG. 4 is a diagram illustrating a method of performing a program operation using an incremental step pulse program (ISPP) method.

FIG. 4 is a diagram illustrating a method of performing a program operation using an incremental step pulse program (ISPP) method.

Referring to FIG. 4, in the program operation using an incremental step pulse program (ISPP) method, the program operation is performed by supplying a program voltage Vpgm to a selected word line, and a program verification operation for the program operation is then performed. The program verification operation is performed in order to determine whether, for example, all the threshold voltages of memory cells included in the selected word line have reached a target level. As described above, the process of supplying the program voltage Vpgm to the selected word line and the process of performing the program verification operation are repeatedly performed until, for example, all the threshold voltages of the memory cells reach the target level.

Referring back to FIG. 3, if, as a result of the program verification operation at step 230, for example, all the threshold voltages of the memory cells are determined to have reached the target level, an over-program verification operation is performed in order to determine whether there are over-programmed cells in the programmed memory cells at step 240.

The over-program verification operation is performed in order to determine whether memory cells whose threshold voltages have reached the target level have been over-programmed. In particular, a difference between the threshold voltage of a memory cell, having a faster program speed than other memory cells, and the threshold voltage of a memory cell which is in a program state of a higher threshold voltage than the threshold voltage of the memory cell having a faster program speed is narrowed. Accordingly, if the threshold voltage of the memory cell having a faster program speed rises because of interference generated during a subsequent program operation, data stored in the memory cell having a faster program speed may be read as different data. For this reason, the over-program verification operation may be performed using a reference level higher than the target level in order to determine whether there are over-programmed cells in the programmed memory cells. If, as a result of the over-program verification operation at step 240, for example, all the threshold voltages of the programmed memory cells are lower than the reference level, the programmed memory cells are determined to be normal memory cells and the program operation is terminated. Further, the over-program verification operation is performed by supplying an over-verification voltage to the selected word line and a pass voltage to unselected word lines. The pass voltage supplied in the over-program verification operation is equal to a verification voltage in a verification operation for determining whether, for example, all the threshold voltages of memory cells have reached a target level.

If, as a result of the over-program verification operation at step 240, there is a memory cell having a threshold voltage higher than the reference level, it is determined whether error checking and correction (ECC) processing using an error correction code is feasible (for example, possible) for the memory cell at step 260. In the error checking and correction (ECC) processing, the number of memory cells which will produce an error, from among the memory cells included in the selected page, is counted. If, as a result of the count, the number of memory cells is smaller than a set number, the error checking and correction (ECC) processing is determined to be feasible. If the error checking and correction (ECC) processing is feasible, data stored in the memory cells may be normally read using the error correction code during a read operation although the memory cells have been over-programmed. However, if lots of error memory cells are generated to the extent that error checking and correction (ECC) processing for the error memory cells is not feasible (i.e., the number of over-programmed cells is equal to or greater than the set number), a next page is selected at step 270 and then the process returns to the step 220.

In other words, if the number of error memory cells included in the selected page is greater than the number of memory cells for which error checking and correction (ECC) processing is feasible, a next page is selected and the program operation is performed on the next page again. If the number of error memory cells included in the selected next page is greater than the number of memory cells for which error checking and correction (ECC) processing is feasible, a second next page is selected and the program operation is performed on the second next page.

An embodiment of a method of performing a program operation using an over-program verification operation is described below.

Figure 5A:
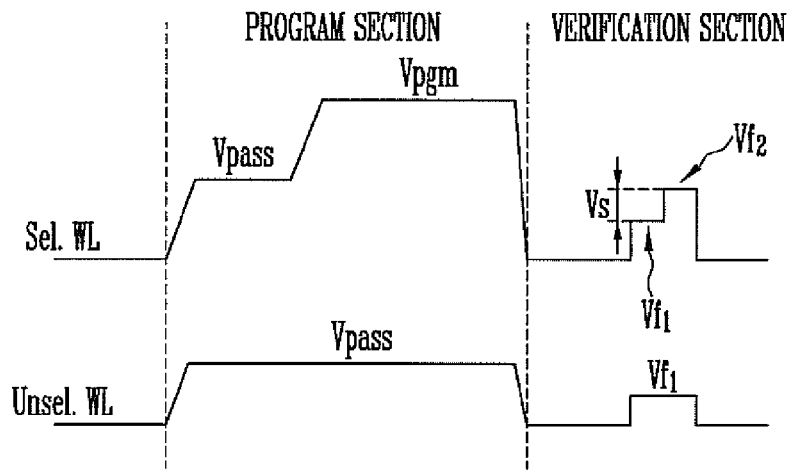
FIGS. 5A to 5C are timing diagrams illustrating a method of performing a program operation according to an exemplary embodiment.
Figure 5B:
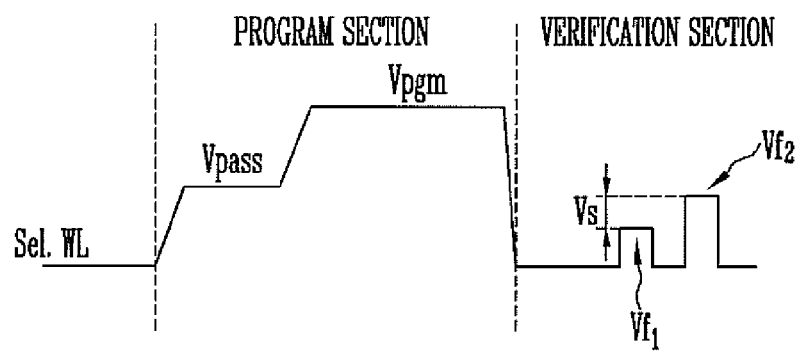
Figure 5C:
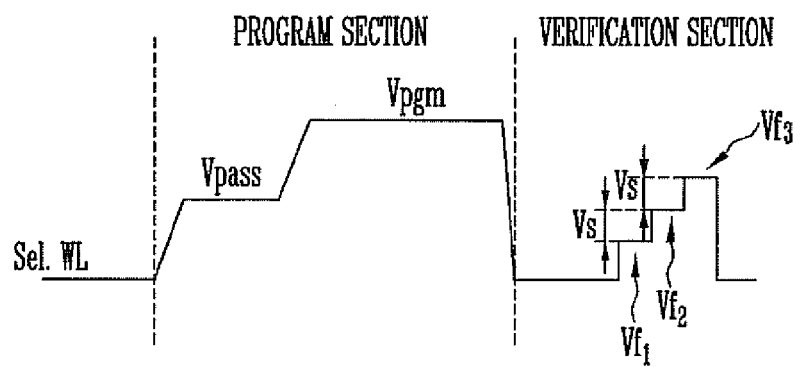

FIGS. 5A to 5C are timing diagrams illustrating a method of performing a program operation according to an exemplary embodiment.

A method of performing a program operation according to a first embodiment is described below with reference to FIG. 5A.

In a program section, the program operation is performed by supplying a program voltage Vpgm to the selected word line Sel. WL and supplying a program pass voltage Vpass to the remaining word lines Unsel. WL.

In a program verification section, only a verification voltage $Vf_1$ is used until, for example, all the threshold voltages of memory cells to be programmed, included in the selected word line, reach a target level. When, for example, all the threshold voltages of the memory cells reach the target level, an over-program verification operation using an over-verification voltage $Vf_2$ is performed. The over-program verification operation may be performed by supplying the verification voltage $Vf_1$ to the selected word line Sel. WL and then supplying the over-verification voltage $Vf_2$ to the selected word line Sel. WL. The program verification operation may be performed by supplying the verification voltage $Vf_1$ or the over-verification voltage $Vf_2$ to the selected word line Sel. WL and the pass voltage Vpass to the remaining word lines Unsel. WL. A difference in the potential of the verification voltage $Vf_1$ and the over-verification voltage $Vf_2$ may be equal to a step voltage Vs which is an increment of the program voltage Vpgm during the program operation.

When a result of the program verification operation is a pass during the program verification operation performed by supplying the verification voltage $Vf_1$ to the selected word line Sel. WL, the over-program verification operation is performed by supplying the over-verification voltage $Vf_2$ in which the step voltage Vs is added to the verification voltage $Vf_1$. The over-program verification operation preferably is performed once in order to reduce the time that it takes to perform the operation although it may be performed several times. Here, a verification pass voltage is supplied to the remaining unselected word lines Unsel. WL. The verification pass voltage supplied to the remaining unselected word lines Unsel. WL may have the same level as the verification voltage $Vf_1$.

A method of performing a program operation according to a second embodiment is described below with reference to FIG. 5B.

Like the first embodiment, when a result of a program verification operation using a verification voltage $Vf_1$ is a pass during a program operation, a selected word line Sel. WL is discharged, and an over-program verification operation is then performed by supplying an over-verification voltage $Vf_2$ higher than the verification voltage $Vf_1$ to the selected word line Sel. WL.

A method of performing a program operation according to a third embodiment is described below with reference to FIG. 5C.

In a program section, a program operation is performed by supplying a program voltage Vpgm to a selected word line Sel. WL and, at the same time, controlling voltage supplied to a bit line so that selected memory cells included in the selected word line Sel. WL have different threshold voltages. Here, first and second verification voltages $Vf_1$ and $Vf_2$ are verification voltages corresponding to programmed memory cells, and a third verification voltage $Vf_3$ is an over-verification voltage for an over-program verification operation. The over-program verification operation is performed when a second program verification operation using the second verification voltage $Vf_2$ is a pass. During the over-program verification operation, the third verification voltage $Vf_3$ supplied to the selected word line Sel. WL preferably is higher than the second verification voltage $Vf_2$ by a step voltage Vs. Alternatively, as in the second embodiment, after the first verification voltage $Vf_1$ is supplied to the selected word line, the selected word line may be discharged. Next, after the second verification voltage $Vf_2$ is supplied to the selected word line, the selected word line may be discharged and the third verification voltage $Vf_3$ may be then supplied to the selected word line.

As described above, during a program operation, a program verification operation for memory cells having irregular electrical characteristics is performed using an over-program verification operation. Accordingly, the reliability of a nonvolatile memory device may be improved.

Furthermore, during a program operation for a selected page, the program operation for a page for which error checking and correction (ECC) processing using an error correction code is not feasible is performed on a next page. Accordingly, the reliability of a program operation and a subsequent read operation may be improved.

What is claimed is:

1. A method of programming a nonvolatile memory device, the method comprising:
   inputting program data to page buffers;
   performing a program operation and a program verification operation until threshold voltages of memory cells included in a selected page reach a target level according to the program data;
   performing an over-program verification operation to determine over-programmed memory cells in the memory cells, wherein the over-program verification operation is performed by supplying an over-program verification voltage to a selected word line associated with the selected page and a pass voltage to unselected word lines associated with unselected pages;
   making a determination of whether error checking and correction (ECC) processing for the over-programmed memory cells is feasible in response to result of the over-program verification operation;
   selecting a next page if the error checking and correction (ECC) processing is not feasible as a result of the determination; and
   performing the program operation and the program verification operation until threshold voltages of memory cells included in the selected next page reach a target level.

2. The method of claim 1, further comprising terminating the program operation for memory cells not over-programmed, as a result of the over-program verification operation.

3. The method of claim 1, wherein the program operation is performed using an incremental step pulse program (ISPP) method.

4. The method of claim 1, wherein the program operation is performed using an incremental step pulse program (ISPP) method.

5. The method of claim 1, wherein the over-program verification voltage is higher than a verification voltage supplied to the selected word line during the program verification operation.

6. The method of claim 1, wherein whether the error checking and correction (ECC) processing is not feasible is determined based on a number of the over-programmed memory cells.

7. The method of claim 6, wherein:
   when the number of over-programmed memory cells is smaller than a set number, the error checking and correction (ECC) processing is determined to be feasible, and when the number of over-programmed memory cells is equal to or greater than the set number, the error checking and correction (FCC) processing is determined to be not feasible.

8. The method of claim 7, wherein the over-program verification operation is performed only when all the threshold voltages of the programmed memory cells are the target level or higher.

9. The method of claim 1, wherein the program operation for the selected next page is repeatedly performed until the threshold voltages of the memory cells included in the selected next page reach the target level.

10. The method of claim 1, further comprising, if the error checking and correction (ECC) processing for the selected next page is not feasible as a result of the program operation for the selected next page, selecting a second next page and performing the program operation on the second next page.

11. A method of performing a program operation for a nonvolatile memory device, the method comprising:
inputting program data to page buffers;
performing a program operation to raise threshold voltages of memory cells to be programmed by supplying a program voltage to a selected word line;
performing a program verification operation to verify whether the threshold voltages of the memory cells have reached a target level by supplying a verification voltage to the selected word line;
repeatedly performing the program operation by raising the program voltage until the threshold voltages of the memory cells reach the target level;
performing an over-program verification operation to determine over-programmed memory cells in the programmed memory cells;
selecting a next pane when the number of over-programmed memory cells is greater than a set number; and
performing the program operation and the program verification operation until threshold voltages of memory cells included in the selected next page reach a target level.

12. The method of claim 11, wherein the program operation is performed using an incremental step pulse program (ISPP) method.

13. The method of claim 11, wherein a pass voltage supplied to unselected word lines during the over-program verification operation has a level equal to the verification voltage supplied to the selected word line during the program verification operation.

14. The method of claim 11, wherein the set number is a number of memory cells for which error checking and correction (ECC) processing is possible.

15. The method of claim 11, wherein the over-program verification operation is performed only when all the threshold voltages of the programmed memory cells are the target level or higher.

16. The method of claim 11, wherein when a number of over-programmed memory cells included in the next page is greater than the set number, a second next page is selected and the program operation is performed on the selected second next page.

17. The method of claim 11, wherein the over-program verification operation is performed by supplying an over-program verification voltage higher than a program verification voltage supplied to the selected word line during the program verification operation.

* * * * *